(12) United States Patent
Chang

(10) Patent No.: US 6,281,074 B1
(45) Date of Patent: Aug. 28, 2001

(54) METHOD OF MANUFACTURING OXIDE LAYER

(75) Inventor: Kow-Ming Chang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/224,686

(22) Filed: Jan. 4, 1999

(51) Int. Cl.⁷ .................................................. H01L 21/336
(52) U.S. Cl. ......................... 438/257; 438/239; 438/250; 438/253; 438/486; 438/770
(58) Field of Search ..................................... 438/239, 250, 438/253, 257, 770, 486, FOR 203, FOR 220, FOR 399, FOR 430, FOR 269

(56) References Cited

U.S. PATENT DOCUMENTS 5,677,867 * 10/1997 Hazani .

6,083,778 * 7/2000 Gardner et al. .

OTHER PUBLICATIONS

"Conventional and Rapid Thermal Processes" McGraw–Hill International Editions (ULSI Technology)/C.Y. Chang and S.M. Sze/p. 169–170. 1996.

\* cited by examiner

*Primary Examiner*—George Fourson
*Assistant Examiner*—Michelle Estrada

(57) ABSTRACT

A method is described for manufacturing an oxide layer. A substrate is provided. An amorphous silicon layer is formed on the substrate. The amorphous silicon layer is recrystallized to form a polysilicon layer. The polysilicon layer is oxidized to form an oxide layer.

23 Claims, 7 Drawing Sheets

METHOD OF MANUFACTURING OXIDE LAYER

BACKGROUND OF THE INVENTION

1. Field of the Invention

The present invention relates to a method of manufacturing a semiconductor device. More particularly, the present invention relates to a method of manufacturing an oxide layer.

2. Description of the Related Art

Currently, oxide layers are widely used in the semiconductor devices since the oxide layers have a relatively good insulating effect. Applications of oxide layers include an inter-metal dielectric layer between two interconnect layers, isolation structures, gate oxide, a dielectric layer between a floating gate and a controlling gate in an electrically erasable and programmable read-only memory (EEPROM) device, etc.

Conventional oxide layer on the rough surface of a polysilicon layer is formed by thermal oxidation. However the roughness of the polysilicon layer surface is determined by the accumulative directions of the polysilicon lattice during thermal oxidation process. Additionally, the range and the configuration of the polysilicon layer are affected by the temperature when the oxide layer is formed by thermal oxidation procedure. Therefore, it is difficult to produce a properly rough surface of the polysilicon layer.

Currently, the step that the oxide layer is formed on the rough surface of a polysilicon layer is usually present in the method of fabricating an EEPROM device. In order to increase the penetration ability of electrons, it is necessary to roughen the surface of the floating gate of the EEPROM device before the oxide layer between the floating gate and the controlling gate is formed. Because the rough surface of the floating gate can enhance the intensity of the local electric field, the penetration ability of electrons is increased.

SUMMARY OF THE INVENTION

It is therefore an objective of the invention to provide a method of manufacturing an oxide layer to improve the quality and immunity of the oxide layer under high-field operation and increase the life time of the oxide layer.

To achieve these and other advantages and in accordance with the purpose of the invention, as embodied and broadly described herein, the invention provides a method of manufacturing an oxide layer. A substrate is provided. An amorphous silicon layer is formed on the substrate. The amorphous silicon layer is recrystallized to form a polysilicon layer. The polysilicon layer is oxidized to form an oxide layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

First Embodiment

Figure 1A:
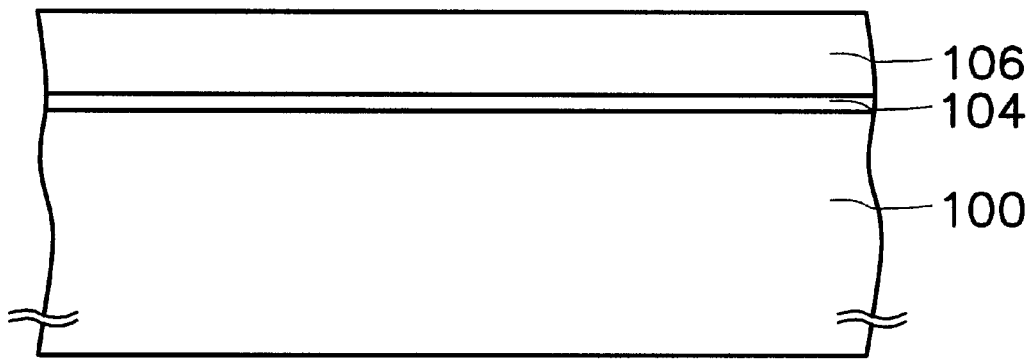
FIGS. 1A through 1D are schematic, cross-sectional views of the process for manufacturing an oxide layer in an EEPROM cell in a preferred embodiment according to the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1D are schematic, cross-sectional view of the process for manufacturing an oxide layer in an EEPROM cell in a first preferred embodiment according to the invention. In the preferred embodiment according to the invention, the process for manufacturing an oxide layer in an EEPROM cell is used as an example of the invention providing a method for manufacturing an oxide layer.

As shown in FIG. 1A, a tunnel oxide layer 104 and a conductive layer 106 are formed on a substrate 100 in sequence. Since the hot electrons tunnel through the tunnel oxide layer 104 while the data are erased and reprogrammed, the thickness of the tunnel oxide layer 104 should be thin and the preferred thickness is about 60–120 angstroms. The conductive layer 106 is predetermined for forming a floating gate of an EEPROM. In this example, the typical method for forming the tunnel oxide layer 104 and the conductive layer 106 comprises the steps of forming a thin oxide layer on the substrate by thermal oxidation. A polysilicon layer is deposited on the thin oxide layer by chemical vapor deposition. An ion implantation step is used to implant dopants into the polysilicon layer to increase the conductivity of the polysilicon layer. The dopants can be phosphorus ions, for example. The energy of the ion implantation is about of 20–50 KeV, and the dosage of the ion implantation is about of $10^{14}$–$10^{15}$ $atoms/cm^2$.

Figure 1B:
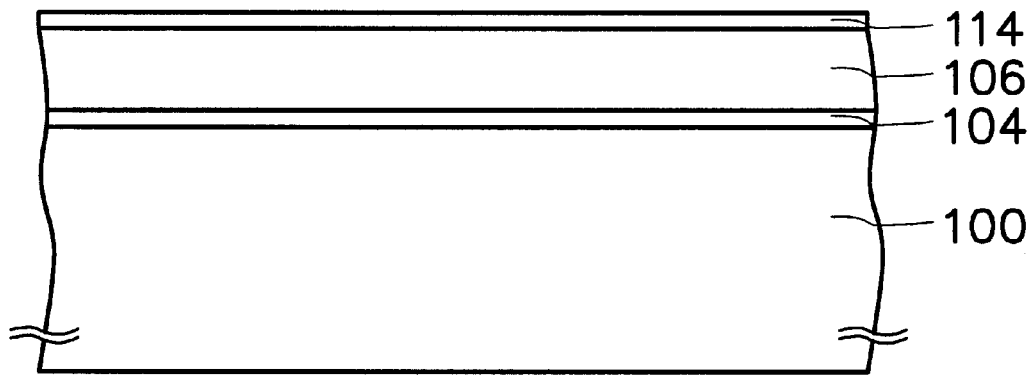

As shown in FIG. 1B, an amorphous silicon layer 114 is formed on the conductive layer 106. In this example, the gas source for forming the amorphous silicon layer 114 can be $SiH_4$ and the temperature of forming the amorphous silicon layer 114 is about 550° C. and the thickness of the amorphous silicon layer 114 is about 75 angstroms.

Figure 1C:
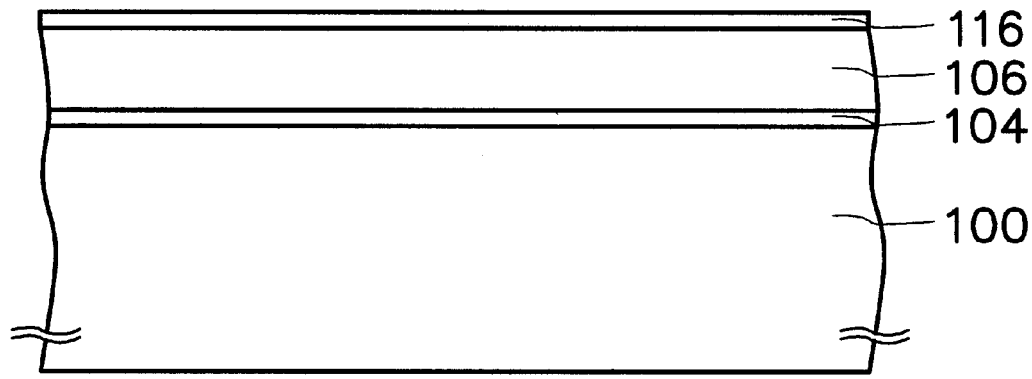

As shown in FIG. 1C, a recrystallization step is performed, and the amorphous silicon layer 114 is recrystallized to form a polysilicon layer 116. The temperature for performing the recrystallization step is about 600° C. and the amorphous silicon layer 114 is recrystallized to form the polysilicon layer 116 for about 24 hours.

Figure 1D:
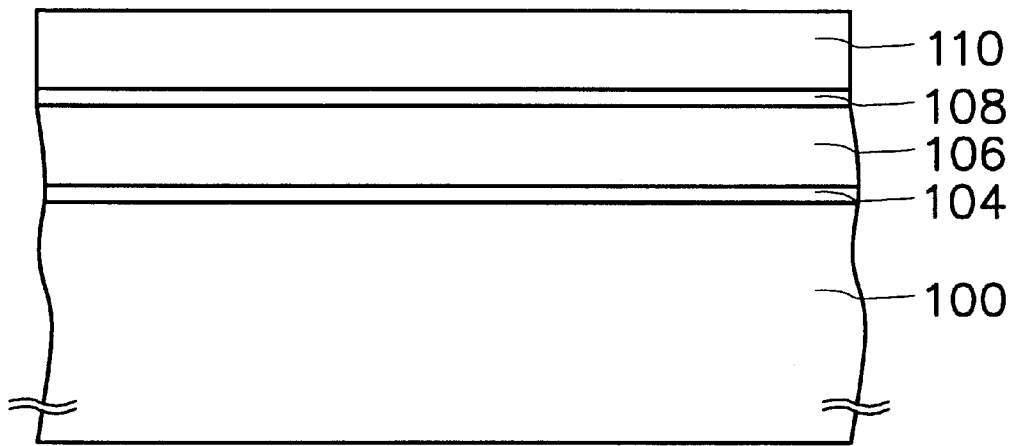

As shown in FIG. 1D, an oxidation step is used to form an oxide layer 108 by oxidizing the polysilicon layer 116. In this example, the oxide layer 108 can be grown in pure $N_2O$ and the temperature for performing the oxidation step is about 900° C. and the thickness of the oxide layer 108 is about 150 angstroms. A conductive layer 110 is formed on the oxide layer 108. The conductive layer 110 is predetermined for forming a controlling gate of an EEPROM. The conductive layer 110 can be a doped polysilicon layer, for example. The thickness of the conductive layer 110 is about of 1000–2000 angstroms. The dopants in the conductive layer 110 can be phosphorus ions, for example. The energy of the ion implantation is about of 20–50 KeV, and the dosage of the ion implantation is about $10^{14}$–$10^{15}$ atoms/cm$^2$.

Figure 1E:
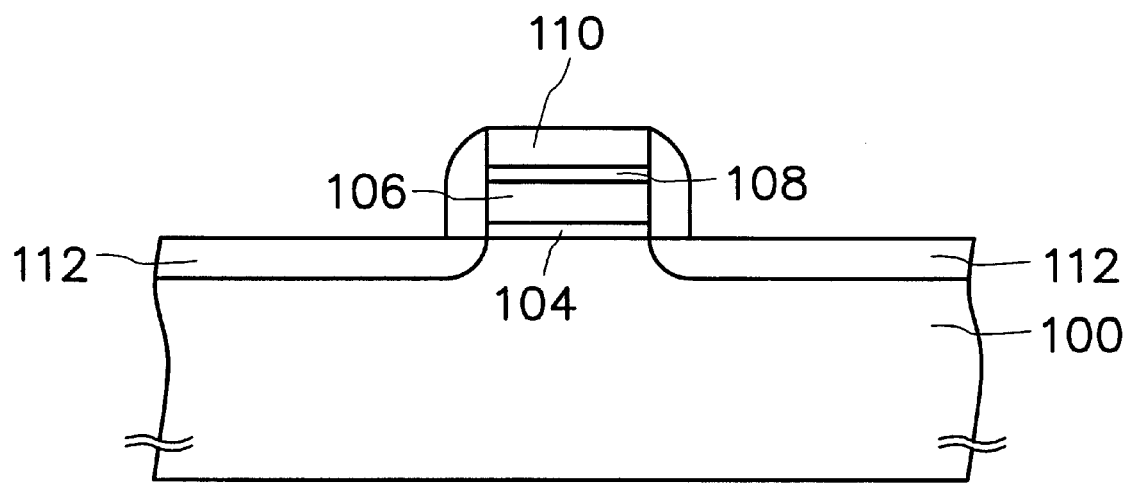
FIG. 1E is a schematic, cross-sectional view of an EEPROM cell.

By performing subsequent steps for fabricating an EEPROM cell, and EEPROM cell is shown in FIG. 1E. The EEPROM cell is based on a MOS transistor element (called a floating-gate transistor) which comprises a tunnel oxide layer 104, a floating gate 106, a oxide layer 108, a controlling gate 110, and a source/drain region 112. The floating gate 106 used to store charges is located above the tunnel oxide layer 104 and beneath the controlling gate 110 and is isolated by the oxide layer 108 from the controlling gate 110. The controlling gate 110 is used to access data. A source/drain region 112 is adjacent to the tunnel oxide layer 104 in the substrate 100. The floating gate 106 is so named due to the fact that it is physically but not electrically isolated from all the other conductive elements in the flash EEPROM device. The controlling gate 110 is electrically connected to one word line (not shown) of the EEPROM device.

Second Embodiment

Reference will now be made in detail to a second preferred embodiment of the invention, examples of which are illustrated in the accompanying drawings. Wherever possible, the same reference numbers are used in the drawings and the description to refer to the same or like parts.

FIGS. 2A through 2D are schematic, cross-sectional views of the process for manufacturing a capacitor in a second preferred embodiment according to the invention.

Figure 2A:
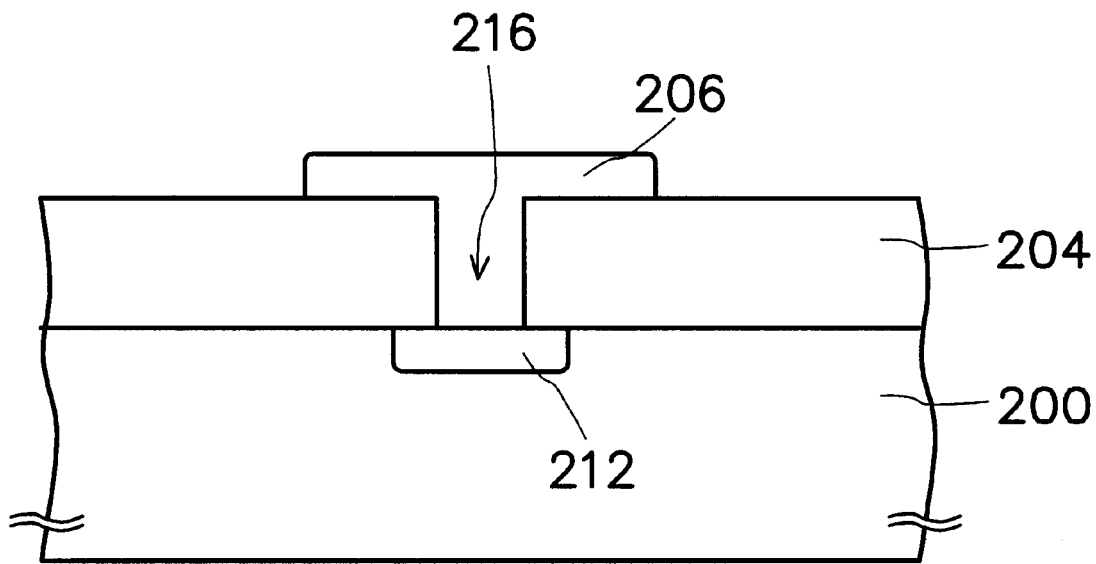
FIGS. 2A through 2D are schematic, cross-sectional views of the process for manufacturing a capacitor in a second preferred embodiment according to the invention.

As shown in FIG. 2A, a dielectric layer 204 is formed over a substrate 200. A node contact hole 216 is formed in the dielectric layer 204 to expose a source/drain region 212 in the substrate 200. The conductive layer (not shown) is formed on the dielectric layer 204 and fills the node contact hole 216. The conductive layer is patterned to form a bottom electrode 206.

Figure 2B:
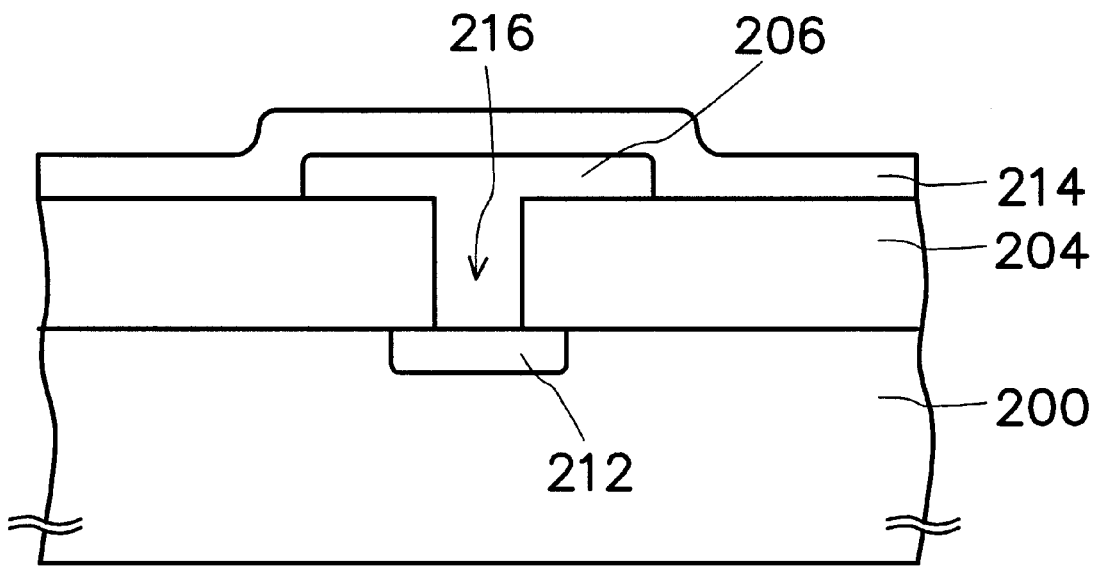

As shown in FIG. 2B, an amorphous silicon layer 214 is formed on the bottom electrode 206 and the dielectric layer 204. In this example, the gas source for forming the amorphous silicon layer 214 can be SiH$_4$ and the temperature of forming the amorphous silicon layer 214 is about 550° C. and the thickness of the amorphous silicon layer 214 is about 75 angstroms.

Figure 2C:
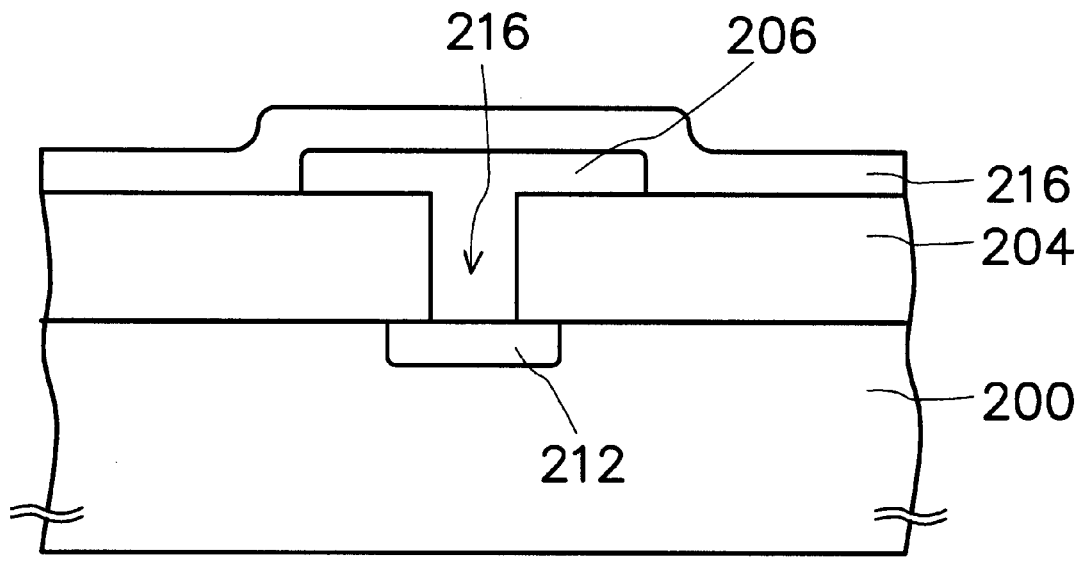

As shown in FIG. 2C, a recrystallization step is performed, and the amorphous silicon layer 214 is recrystallized to form a polysilicon layer 216. The temperature for performing the recrystallization step is about 600° C. and the amorphous silicon layer 214 is recrystallized to form the polysilicon layer 216 for about 24 hours.

Figure 2D:
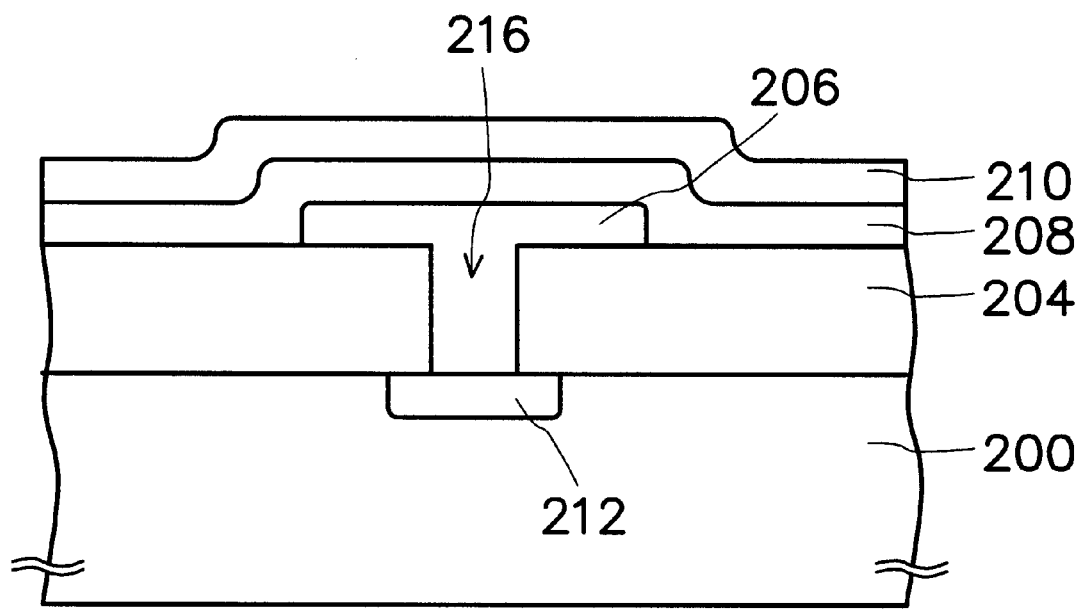

As shown in FIG. 2D, an oxidation step is used to form an oxide layer 208 by oxidizing the polysilicon layer 216. In this example, the oxide layer 208 can be grown in pure N$_2$O and the temperature for performing the oxidation step is about 900° C. and the thickness of the oxide layer 208 is about 150 angstroms. A conductive layer 210 is formed on the oxide layer 208. The conductive layer 210 is predetermined for forming a upper electrode of a capacitor.

In the second preferred embodiment according to the invention, the shape of the capacitor is denoted as a stacked capacitor. It is appreciated that people skilled in the art may also adopt the technique mentioned above to fabricate different kind of capacitors such as fin-structured capacitor, crown capacitor, spread-stacked capacitor and box-structured capacitor.

Figure 3:
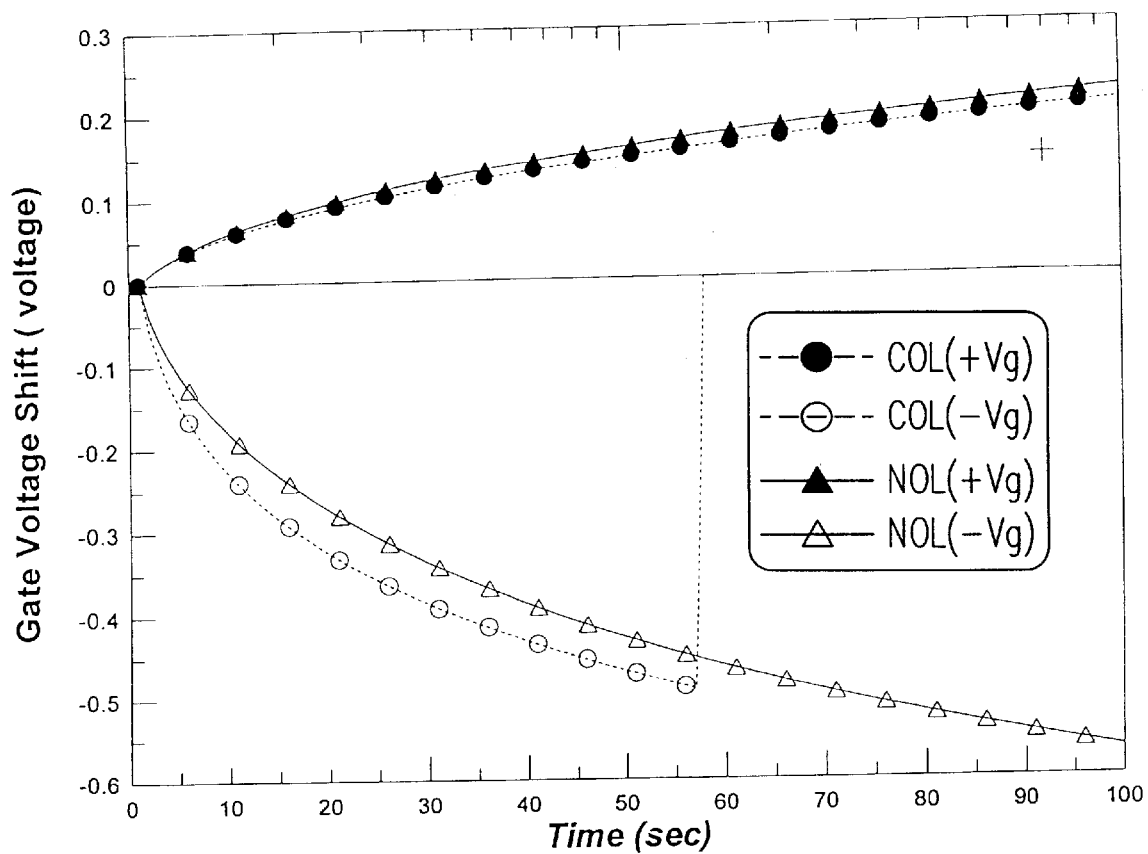
FIG. 3 is a plot of the gate voltage shift ($\Delta Vg$) versus the stress time with the injection polarities from gate ($-Vg$) and substrate ($+Vg$) under a constant current stress of 10 $mA/cm^2$.

FIG. 3 shows the plot of the gate voltage shift ($\Delta Vg$) versus the stress time with the injection polarities from gate (−Vg) and substrate (+Vg) under a constant current stress of 10 mA/cm$^2$. The $\Delta Vg$ of the new oxide layer (denoted as NOL) is similar to that of the conventional oxide layer (denoted as COL) when the conductive layer above the oxide layer is positively-based (+Vg), but the $\Delta Vg$ of the NOL is about 0.5V less than that of the COL when the conductive layer above the oxide layer is negatively-based (−Vg). This implies that the NOL has a relatively high quality and good immunity to electron trapping under high-field operation.

Figure 4:
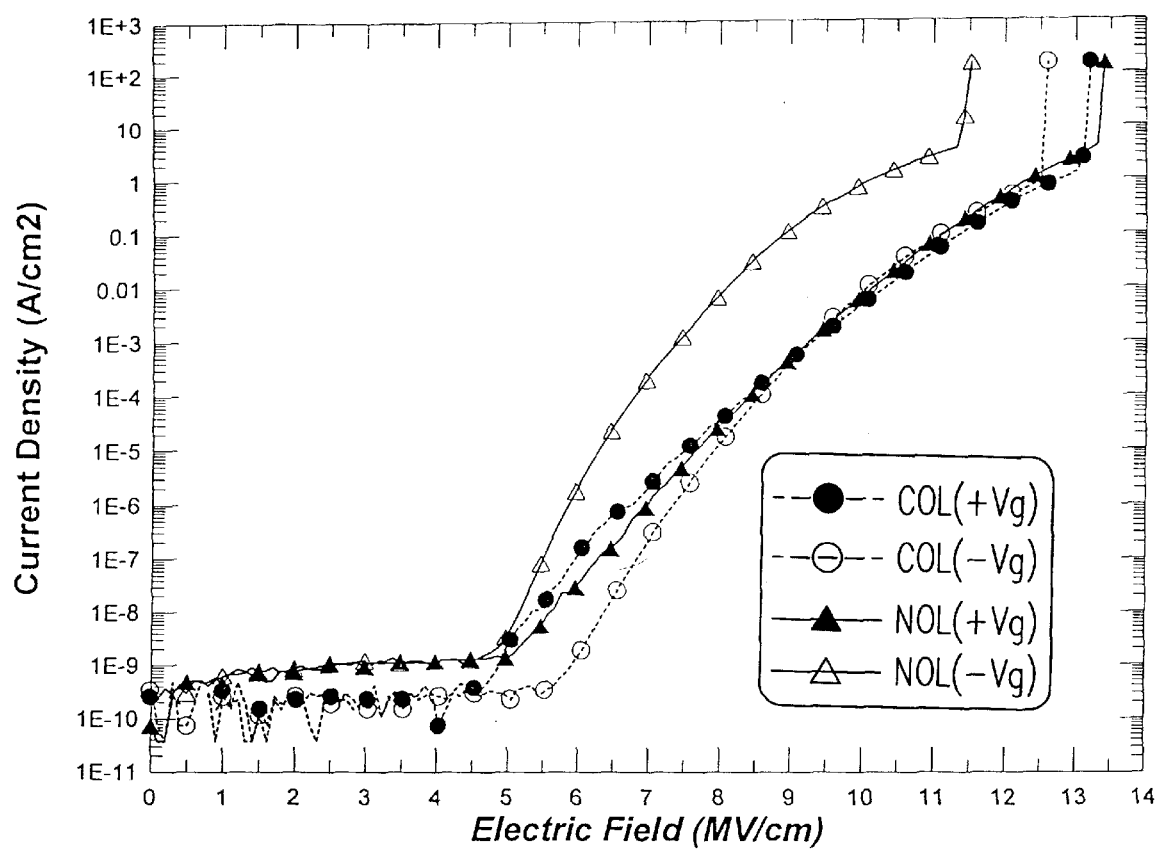
FIG. 4 is a plot of the typical current density versus electric field characteristics of the oxide layers.

FIG. 4 shows the typical current density versus electrical field characteristics of the oxide layers. The current density versus electrical field curve of the NOL is almost the same as that of the COL when the conductive layer above the oxide layer is positively-based (+Vg), while the NOL conducts a current at a constant electric field that is two orders larger than that of the COL when the conductive layer above the oxide layer is negatively-based (−Vg). This implies that the NOL can change the charge stored on the floating gate with a relatively high efficiency.

Figure 5:
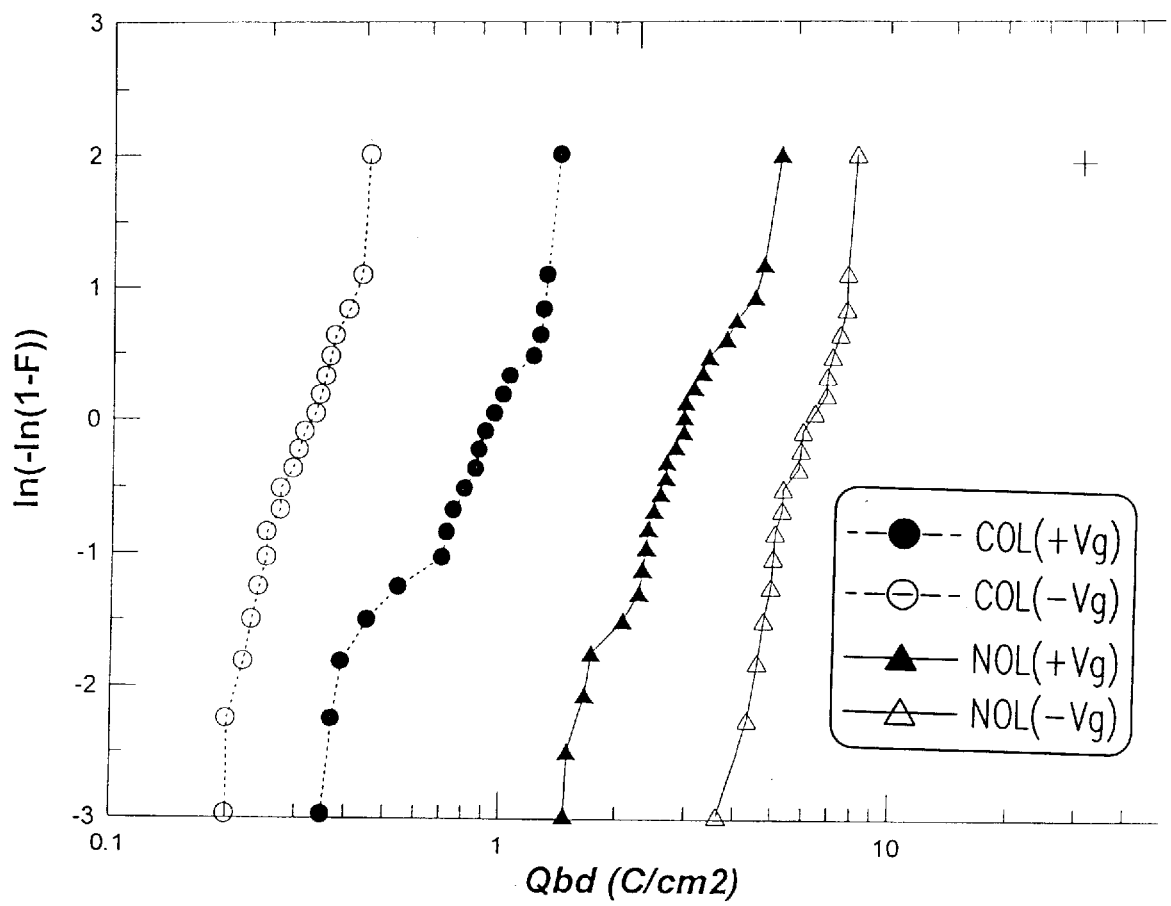
FIG. 5 is the Weibull plot of charge-to-breakdown (Qbd) of the new oxide layer and the conventional oxide layer under 100 $mA/cm^2$ stress.

FIG. 5 shows the Weibull plot of charge-to-breakdown (Qbd) of the NOL and the COL under 100 mA/cm$^2$ stress. It is found that Qbd is greatly enhanced by the invention, due to the reduced electron trapping. The Qbd of the NOL is about one order larger than that of the COL. It implies that the NOL has a relatively long life time.

The preferred embodiment according to the invention is denoted by manufacturing an oxide layer of an EEPROM cell. It is appreciated that people skilled in the art may also adopt the technique mentioned about to fabricate the intermetal dielectric layer between two interconnect layers, the dielectric between upper electrode and bottom electrode of the capacitor, etc.

In the invention, the amorphous silicon layer is formed on the conductive layer and recrystallized to form a polysilicon layer. The polysilicon layer is oxidized to form an oxide layer. When compared with the conventional oxide layer formed by thermal oxidation, the oxide layer formed by the method according to the invention has a relatively high quality and good quality under high-field operation, and a relatively long life time. Moreover, when the invention is applied to form the oxide layer between the floating gate and the controlling gate in the EEPROM cell, it can improve the efficiency of the data access. Furthermore, the invention can easily form an oxide layer on the rough surface of the floating gate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing an oxide layer, comprising the steps of:

providing a substrate with a first conductive layer having an exposed rough surface;

forming an amorphous silicon layer over the substrate and the rough surface;

recrystallizing the amorphous silicon layer to form a polysilicon layer;

oxidizing the polysilicon layer into an oxide layer with an even surface; and forming a second conductive layer over the oxide layer, wherein the oxide layer remains without being removed.

2. The method of claim 1, wherein the amorphous silicon layer is recrystallized at about 600° C. for about 24 hours.

3. The method of claim 1, wherein the thickness of the amorphous silicon layer is about 75 angstroms.

4. The method of claim 1, wherein the amorphous silicon layer is formed at about 550° C.

5. The method of claim 1, wherein the polysilicon layer is oxidized at about 900° C.

6. The method of claim 1, wherein the thickness of the oxide layer is about 150 angstroms.

7. The method of claim 1, wherein the step of forming the amorphous silicon layer further comprises a gas $SiH_4$ used as a source for forming the amorphous silicon layer.

8. The method of claim 1, wherein the step of oxidizing the polysilicon layer further comprises a pure gas $N_2O$ used to oxidize the polysilicon layer.

9. A method of manufacturing an oxide layer on a floating gate of an electrically erasable and programmable read-only memory, comprising the sequential steps of:

forming an amorphous silicon layer on the floating gate that has a rough surface;

recrystallizing the amorphous silicon layer to form a polysilicon layer;

oxidizing the polysilicon layer into an oxide layer; and forming a controlling gate on the oxide layer.

10. The method of claim 9, wherein the amorphous silicon layer is recrystallized at about 600° C. for about 24 hours.

11. The method of claim 9, wherein the thickness of the amorphous silicon layer is about 75 angstroms.

12. The method of claim 9, wherein the amorphous silicon layer is formed at about 550° C.

13. The method of claim 9, wherein the polysilicon layer is oxidized at about 900° C.

14. The method of claim 9, wherein the thickness of the oxide layer is about 150 angstroms.

15. The method of claim 9, wherein the step of forming the amorphous silicon layer further comprises a gas $SiH_4$ used as a source for forming the amorphous silicon layer.

16. The method of claim 9, wherein the step of oxidizing the polysilicon layer further comprises a pure gas $N_2O$ used to oxidize the polysilicon layer.

17. A method of manufacturing an oxide layer on a bottom electrode of a capacitor, comprising the steps of:

forming an amorphous silicon layer over the bottom electrode that has a rough surface;

recrystallizing the amorphous silicon layer to form a polysilicon layer;

oxidizing the polysilicon layer to form an oxide layer; and forming an upper electrode on the oxide layer.

18. The method of claim 17, wherein the amorphous silicon layer is recrystallized at about 600° C. for about 24 hours.

19. The method of claim 17, wherein the thickness of the amorphous silicon layer is about 75 angstroms.

20. The method of claim 17, wherein the amorphous silicon layer is formed at about 550° C.

21. The method of claim 17, wherein the polysilicon layer is oxidized at about 900° C.

22. The method of claim 17, wherein the thickness of the oxide layer is about 150 angstroms.

23. The method of claim 1, wherein in the oxidizing step, the polysilicon layer is substantially entirely converted into the oxide layer.

* * * * *